US009825210B2

(12) United States Patent
Humfeld

(10) Patent No.: US 9,825,210 B2
(45) Date of Patent: Nov. 21, 2017

(54) GROWTH OF CARBON NANOTUBE (CNT) LEADS ON CIRCUITS IN SUBSTRATE-FREE CONTINUOUS CHEMICAL VAPOR DEPOSITION (CVD) PROCESS

(71) Applicant: The Boeing Company, Chicago, IL (US)

(72) Inventor: Keith Daniel Humfeld, Federal Way, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/287,893

(22) Filed: Oct. 7, 2016

(65) Prior Publication Data
US 2017/0077370 A1  Mar. 16, 2017

Related U.S. Application Data

(62) Division of application No. 14/853,004, filed on Sep. 14, 2015, now Pat. No. 9,544,998.

(51) Int. Cl.
| | |
|---|---|
| *H01L 29/205* | (2006.01) |
| *H01L 33/62* | (2010.01) |
| *H05K 1/09* | (2006.01) |
| *H01L 51/00* | (2006.01) |
| *H01L 25/075* | (2006.01) |
| *H05K 3/12* | (2006.01) |

(52) U.S. Cl.
CPC .......... *H01L 33/62* (2013.01); *H01L 51/0048* (2013.01); *H05K 1/09* (2013.01); *H01L 25/0753* (2013.01); *H05K 1/097* (2013.01); *H05K 3/1275* (2013.01); *H05K 2201/026* (2013.01); *H05K 2201/0323* (2013.01)

(58) Field of Classification Search
CPC .. H01L 51/0048; H01L 33/62; H01L 25/0753
USPC ............................................................ 257/91
See application file for complete search history.

(56) References Cited

U.S. PATENT DOCUMENTS

| | | | |
|---|---|---|---|
| 6,232,706 B1 * | 5/2001 | Dai .................. | B82Y 10/00 313/309 |
| 6,989,325 B2 | 1/2006 | Uang et al. | |
| 7,084,507 B2 * | 8/2006 | Awano .............. | B82Y 10/00 257/734 |

(Continued)

OTHER PUBLICATIONS

Vincent Jourdain et al., "Current understanding of the growth of carbon nanotubes in catalytic chemical vapour deposition", HAL archives-ouvertes.fr, HAL Id: hal-01067024, https://hal.archives-ouvertes.fr/hal-01067024, Submitted on Sep. 22, 2014, pp. 1-102.

*Primary Examiner* — Mark Tornow
(74) *Attorney, Agent, or Firm* — MH2 Technology Law Group LLP

(57) ABSTRACT

A method and structure for an electrical device and a plurality of electrical circuits including a plurality of carbon nanotubes (CNTs). The method can include forming a first CNT catalyst layer including a plurality of first CNT catalyst plugs, a plurality of electrical circuits electrically coupled to the first CNT catalyst layer, and a second CNT catalyst layer including a plurality of second CNT catalyst plugs electrically coupled to the second CNT catalyst layer. CNTs may be simultaneously formed on the plurality of first and second CNT catalyst plugs within a chemical vapor deposition (CVD) furnace.

20 Claims, 4 Drawing Sheets

(56) References Cited

U.S. PATENT DOCUMENTS

| | | | |
|---|---|---|---|
| 7,135,159 B2 | 11/2006 | Shaffer et al. | |
| 8,004,076 B2 * | 8/2011 | Zarbock | B81C 1/00269 |
| | | | 257/690 |
| 8,106,517 B2 | 1/2012 | Kabir et al. | |
| 8,887,663 B2 | 11/2014 | Stebbins et al. | |
| 2008/0227294 A1 * | 9/2008 | Suh | B82Y 10/00 |
| | | | 438/687 |
| 2010/0252317 A1 * | 10/2010 | Gritters | B82Y 10/00 |
| | | | 174/261 |
| 2012/0171106 A1 | 7/2012 | Barker et al. | |

* cited by examiner

GROWTH OF CARBON NANOTUBE (CNT) LEADS ON CIRCUITS IN SUBSTRATE-FREE CONTINUOUS CHEMICAL VAPOR DEPOSITION (CVD) PROCESS

CROSS-REFERENCE TO RELATED APPLICATIONS

This application is a divisional of U.S. application Ser. No. 14/853,004, filed Sep. 14, 2015, and issued Jan. 10, 2017, as U.S. Pat. No. 9,544,998, the disclosure of which is incorporated herein by reference in its entirety.

TECHNICAL FIELD

The present teachings relate to the field of carbon nanotubes and, more particularly, to the selective formation of carbon nanotubes on a substrate.

BACKGROUND

Carbon nanotubes (CNTs) such as single-walled CNTs (SWCNTs) and multi-walled CNTs (MWCNTs) are known to have valuable qualities as structural and electrical materials with utility in a wide range of fields as diverse as textiles, concrete, polyethylene, synthetic muscles, high tensile strength fibers, and fire protection. CNTs can be fabricated as electrical conductors, electrical insulators, and electrical semiconductors.

An electrical circuit is typically formed on one side of a semiconductor substrate, and CNTs may be formed on one side of the electrical circuit within a furnace or reactor using a process such as a chemical vapor deposition (CVD). A lower surface of the substrate may rest on a supporting base of the furnace, then a CNT catalyst on an upper surface of the substrate is exposed to a reactant gas within the furnace that chemically reacts in the presence of the CNT catalyst to form one or more CNTs.

Conventional formation of CNTs includes the use of batch processing, where a substrate is placed into a cool furnace, a chamber of the furnace and the substrate are brought up to a target temperature, CNTs are grown on the substrate at the target temperature, the furnace chamber and substrate are cooled, the substrate including CNTs is removed from the cool chamber, and another substrate is placed into the chamber, and the CNT formation process may be repeated.

A batch formation process is inefficient and may be costly compared to a continuous formation process. Additionally, the CNT formation process described above forms CNTs on only one side of the substrate and on one side of the electrical circuit.

A method for forming mechanically robust CNT electrical leads on two or more sides of a substrate and/or on two or more sides of an electrical circuit using a continuous manufacturing process would be desirable.

SUMMARY

The following presents a simplified summary in order to provide a basic understanding of some aspects of one or more examples of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an example, a method for forming a plurality of electrical circuits can include forming a first carbon nanotube (CNT) catalyst layer including a plurality of first CNT catalyst plugs over a release layer, forming a plurality of electrical circuits over the first CNT catalyst layer, wherein each electrical circuit is in electrical communication with the first CNT catalyst layer, and forming a second CNT catalyst layer including a plurality of second CNT catalyst plugs over the plurality of electrical circuits, wherein each electrical circuit is in electrical communication with the second CNT catalyst layer. The method can further include removing the release layer to expose the plurality of first CNT catalyst plugs, and simultaneously forming a plurality of CNTs on the plurality of first CNT catalyst plugs and on the second plurality of CNT catalyst plugs within a chamber of a reactor. The method can further include sectioning the plurality of electrical circuits into a plurality of individual electrical circuits prior to removing the release layer, and feeding the plurality of individual electrical circuits into the chamber of the reactor subsequent to removing the release layer. The plurality of individual electrical circuits may be fed into the chamber of the reactor such that the plurality of individual electrical circuits are free-floating within the chamber for a period of time during the simultaneous formation of the CNTs on the first CNT catalyst plugs and the second CNT catalyst plugs.

The method can further include forming the release layer on a substrate prior to forming the first CNT catalyst layer, and sectioning the plurality of electrical circuits into a plurality of individual electrical circuits to expose a surface of the substrate prior to removing the release layer. Additionally, the method can further include forming the first CNT catalyst layer using a process including forming the plurality of first CNT catalyst plugs within a first inert layer such that the first CNT catalyst layer includes the plurality of first CNT catalyst plugs and the first inert layer, and forming the second CNT catalyst layer using a process including forming the plurality of second CNT catalyst plugs within a second inert layer such that the second CNT catalyst layer includes the plurality of second CNT catalyst plugs and the second inert layer. The plurality of electrical circuits may be ejected from an exhaust port subsequent to forming the plurality of CNTs, and may be ejected from the exhaust port onto a conveyor belt subsequent to forming the plurality of CNTs. The plurality of electrical circuits may further be ejected from the exhaust port onto a surface to form a mat of electrical circuits. The release layer may be formed from photoresist.

In an example, the method can further include sectioning the plurality of electrical circuits into a plurality of individual electrical circuits prior to removing the release layer, feeding the plurality of individual electrical circuits into the chamber of the reactor subsequent to removing the release layer such that the plurality of individual electrical circuits are free-floating within the chamber for a period of time during the simultaneous formation of the CNTs on the first CNT catalyst plugs and the second CNT catalyst plugs, and flowing a gas into the chamber in an upflow direction through at least one upflow port to increase the period of time the plurality of individual electrical circuits remain within the chamber prior to exiting the chamber.

In another example, the method can further include forming the release layer on a substrate prior to forming the first CNT catalyst layer, forming the first CNT catalyst layer using a process including forming the plurality of first CNT catalyst plugs within a first inert layer such that the first CNT catalyst layer includes the plurality of first CNT catalyst plugs and the first inert layer, forming the second CNT catalyst layer using a process including forming the plurality of second CNT catalyst plugs within a second inert layer such that the second CNT catalyst layer includes the plurality of second CNT catalyst plugs and the second inert layer, sectioning the plurality of electrical circuits into a plurality of individual electrical circuits thereby exposing a surface of the substrate prior to removing the release layer, feeding the plurality of individual electrical circuits into the chamber of the reactor subsequent to removing the release layer such that the plurality of individual electrical circuits are free-floating within the chamber for a period of time during the simultaneous formation of the CNTs on the first CNT catalyst plugs and the second CNT catalyst plugs, and ejecting the plurality of electrical circuits from an exhaust port subsequent to forming the plurality of CNTs.

The first CNT catalyst layer may be on a first major surface of the plurality of electrical circuits and the method can further include forming the second CNT catalyst layer on a second major surface of the plurality of electrical circuits, wherein the first major surface is opposite the second major surface and the plurality of electrical circuits are interposed between the first CNT catalyst layer and the second CNT catalyst layer.

In an example, the method can further include applying an electrical conductor to at least one CNT of one electrical circuit of the plurality of electrical circuits and to at least one electrically conductive pad of a circuit substrate to electrically couple the at least one CNT to the at least one electrically conductive pad.

An electrical device according to an embodiment can include a first carbon nanotube (CNT) catalyst layer including a first CNT catalyst plug electrically coupled to the electrical circuit, a first CNT electrically coupled to the first CNT catalyst plug, a second CNT catalyst layer including a second CNT catalyst plug electrically coupled to the electrical circuit, and a second CNT electrically coupled to the second CNT catalyst plug, wherein the electrical circuit is interposed between the first CNT catalyst layer and the second CNT catalyst layer. The first CNT and the second CNT of the plurality of electrical circuits may be intertwined and in electrical communication with each other, such that the plurality of electrical circuits form a mat. The electrical device can further include a carrier material interposed between adjacent electrical circuits of the plurality of electrical circuits. The plurality of electrical circuits may be a plurality of light emitting diodes.

In another example, an electrical device can include an electrical circuit, a first carbon nanotube (CNT) catalyst layer including a first CNT catalyst plug electrically coupled to the electrical circuit, a first CNT electrically coupled to the first CNT catalyst plug, a second CNT catalyst layer including a second CNT catalyst plug electrically coupled to the electrical circuit, and a second CNT electrically coupled to the second CNT catalyst plug, wherein the electrical circuit is interposed between the first CNT catalyst layer and the second CNT catalyst layer. The electrical device may be a diode. The electrical device may further include a substrate having a first electrically conductive pad and a second electrically conductive pad, a first electrical conductor that electrically couples the first CNT to the first electrically conductive pad, and a second electrical conductor that electrically couples the second CNT to the second electrically conductive pad. The substrate may be a printed circuit board.

BRIEF DESCRIPTION OF THE DRAWINGS

The accompanying drawings, which are incorporated in, and constitute a part of this specification, illustrate examples of the present teachings and, together with the description, serve to explain the principles of the disclosure. In the figures.

It should be noted that some details of the FIGS. have been simplified and are drawn to facilitate understanding of the present disclosure rather than to maintain strict structural accuracy, detail, and scale.

DETAILED DESCRIPTION

Reference will now be made in detail to exemplary examples of the present teachings, examples of which are illustrated in the accompanying drawings. Wherever possible, the same reference numbers will be used throughout the drawings to refer to the same or like parts.

As described above, some conventional CNT formation processes may use batch processing, which is time consuming, inefficient, and costly. Additionally, CNTs may not be formed on two opposite major surfaces or sides of a substrate simultaneously. The present disclosure can include the formation of CNTs on two opposite major surfaces or sides of a substrate using a continuous manufacturing process.

FIGS. 1-8 depict various in-process structures that may be formed during an example of the present disclosure to form a plurality of electrical circuits including self-aligned CNTs that may provide electrical leads. The CNTs may be "self-aligned" to the electrical circuit as they form only at desired locations, on desired structures, and perpendicular to the substrate without requiring a separate mask to prevent formation at undesired locations, although other examples that include the use of a separate mask to prevent formation at undesired locations are also contemplated. It will be apparent to one of ordinary skill in the art that the structures depicted in the FIGS. represent generalized schematic illustrations and that other structures or elements may be added or existing structures or elements may be removed or modified.

Figure 1:
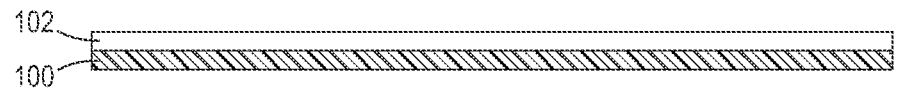
FIGS. 1-8 are cross sections depicting the simultaneous formation of a plurality of electrical circuits having self-aligned carbon nanotube electrical leads on two or more sides or surfaces of the electrical circuit in an embodiment of the present disclosure.

FIG. 1 depicts a starting substrate 100 that may be, for example, a semiconductor wafer, a metal layer, a quartz substrate, a polymer substrate, or another suitable substrate. In various examples, the substrate 100 may be a sacrificial substrate that provides support for subsequent structures formed during an example, but is not present in a completed circuit.

FIG. 1 further depicts a sacrificial release layer 102 formed on the substrate 100. The release layer 102 may be a layer that can be dissolved, etched, softened, or removed selective to other layers during circuit processing. The release layer 102 may be, for example, a photoresist layer such as SU-8 epoxy-based photoresist or an oxide layer or a nitride layer that is grown, deposited or otherwise formed on a surface of the substrate 100. In an example, the release layer 102 may have a thickness of from about 0.1 micrometers (μm) to about 20 μm. In some examples, the release layer 102 may sufficiently function in place of the substrate 100 such that a separate substrate 100 is not required.

Figure 2:
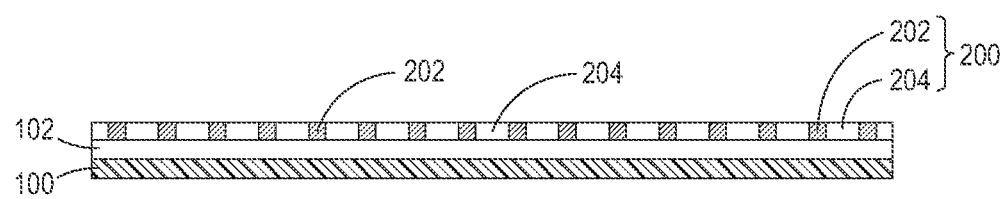

Subsequently, a first CNT catalyst layer 200 is formed on the release layer 102 as depicted in FIG. 2, where the first CNT catalyst layer 200 may include a plurality of individual first CNT catalyst plugs, contacts, and/or interconnects 202 (hereinafter, collectively, plugs) interspersed within an inert material 204. Each first CNT catalyst plug 202 may be electrically conductive (which includes electrically semi-conductive) to provide an electrically functional part of a circuit, while the inert material 204 may be an electrical dielectric that is not electrically active during circuit operation. The first CNT catalyst layer 200 may be formed using conventional wafer fabrication techniques. In one example, an optional blanket inert layer may be masked and etched to form a plurality of openings within the blanket inert layer, then a damascene metal fabrication process or a chemical or physical deposition process (e.g., CVD, plasma enhanced CVD, atomic layer deposition, physical vapor deposition, etc.) can be used to form the plurality of discrete first CNT catalyst plugs 202 in the openings formed within the blanket inert layer.

The inert material 204 may be any dielectric material that resists the formation of a CNT material when exposed to a CNT-forming atmosphere or precursor. For example, the inert material 204 may be a silicon oxide layer, a silicon nitride layer, or another suitable material. The first CNT catalyst plugs 202 may be any electrically conductive material that is suitable for catalyzing the formation of a CNT material when exposed to a CNT-forming atmosphere or precursor. For example, the first CNT catalyst plugs 202 may be a transition metal such as Group VIB chromium (Cr), molybdenum (Mo), tungsten (W) or Group VIIIB transition metals, e.g., iron (Fe), cobalt (Co), nickel (Ni), ruthenium (Ru), rhodium (Rh), palladium (Pd), osmium (Os), iridium (Ir) and platinum (Pt) or mixtures thereof. Metals from the lanthanide and actinide series may also be used. Preferred are Fe, Ni, Co, Mo and mixtures thereof such as a 50/50 mixture (by weight) of Ni and Co, or a mixture of Fe and Ni, or a mixture of Fe and Mo. Any of these transition metals individually or in combination with any of the other transition metals listed may be used in clusters to serve as a catalyst for carbon nanotube growth, and mixtures of two or more of these. The materials described above are merely exemplary of CNT-forming atmospheres and are not intended to be limiting. Other non-metal materials such as a layer including carbon are also contemplated.

The first CNT catalyst layer 200 may have a thickness of from about 4 nanometers (nm) to about 40 nm, or another suitable thickness.

Figure 3:
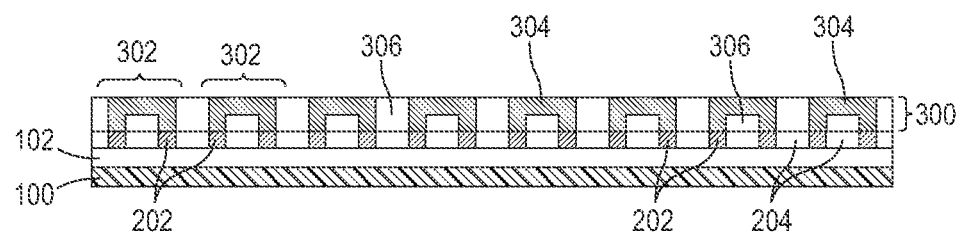

Subsequently, a circuit layer 300 including a plurality of electrical circuits 302 may be formed on the CNT catalyst layer 200 as depicted in FIG. 3. It will be understood that the depiction of electrical circuits 302 is intended to be illustrative of any electrical circuit that is compatible with the CNT methods and structures described herein, and is in no way limiting to any particular circuit design or function. The circuit layer 300 may be formed using conventional wafer fabrication techniques, and may include one or more electrically conductive layers 304 that are at least partially conductive (e.g., one or more electrically conductive layers and/or one or more electrically semiconductive layers) and dielectric layers 306 that may vary according to the design of each electrical circuit 302. Each electrical circuit 302 may be formed to physically and/or electrically contact one or more of the first CNT catalyst plugs 202 as depicted, such that at least one of the conductive layers 304 of each electrical circuit 302 is in electrical communication with one or more of the first CNT catalyst plugs 202 of the first CNT catalyst layer 200.

Figure 4:
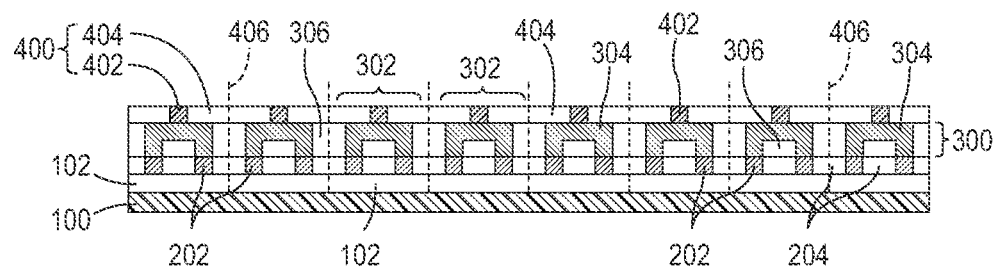

Next, a second CNT catalyst layer 400 is formed on the circuit layer 300 as depicted in FIG. 4, where the second CNT catalyst layer 400 may include a plurality of individual second CNT catalyst plugs 402 interspersed within an inert material 404. Each second CNT catalyst plug 402 may be electrically conductive, while the inert material 404 may be an electrical dielectric. The second CNT catalyst layer 400 may be formed to include the same materials as the first CNT catalyst layer 200, or different materials. Each second CNT catalyst plug 402 may be formed to physically and/or electrically contact one or more conductive layers 304 of each electrical circuit 302 as depicted, such that at least one of the conductive layers 304 of each electrical circuit 302 is in electrical communication with one or more of the second CNT catalyst plugs 402 of the second CNT catalyst layer 400.

FIG. 4 further depicts, in phantom, locations of a plurality of kerf or street regions 406, where each kerf is interposed between adjacent electrical circuits 302. The kerf regions 406 are positioned at locations where material is to be removed during a subsequent dicing, etching, or other process that physically separates or segments the plurality of electrical circuits 302 from each other. Dicing may be performed using, for example, a wafer dicing saw. Etching may be performed using, for example, an anisotropic or vertical dry etch.

Figure 5:
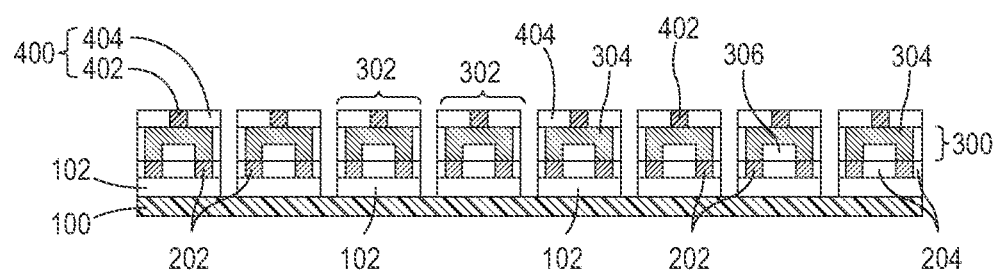

FIG. 5 depicts the FIG. 4 structure after dicing, etching, singularizing, segmenting, or otherwise sectioning each electrical circuit 302 of the plurality of electrical circuits from each other. In FIG. 5, the inert layers 204, 404, the circuit dielectric layer 306, and the release layer 102 have been sectioned to expose the upper surface of the substrate 100, while the substrate 100 remains unsectioned. In another embodiment, the substrate 100 may also be sectioned such that a plurality of individual and discrete circuit chips are formed by the sectioning process. In another example, the release layer 102 may not be sectioned at this point, but subsequently dissolved, etched, or otherwise removed to release the electrical circuits 302 as discussed below.

Figure 6:
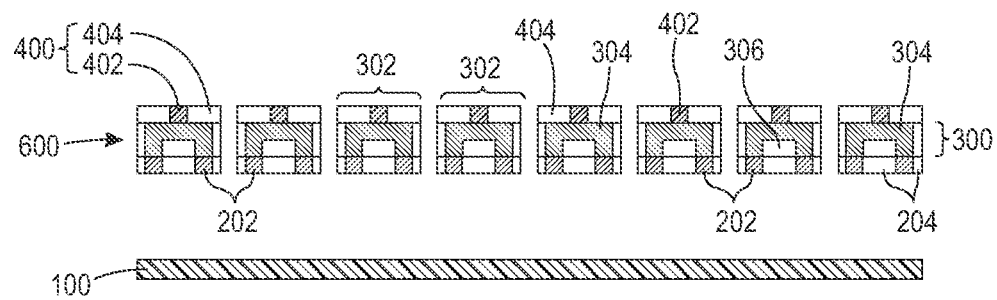

As depicted in FIG. 6, the release layer 102 is dissolved, etched, or otherwise removed from the substrate 100 and from each electrical circuit 302 such that the plurality of electrical circuits 302 are released from the substrate 100. Additionally, removing the release layer 102 exposes the first CNT catalyst plugs 202 and the inert layer 204 of the first CNT catalyst layer 200. In FIG. 6, the substrate 100 remains intact and may be reused to form another plurality of electrical circuits 302. If the substrate 100 is segmented into a plurality of individual substrate sections during sectioning of the FIG. 4 structure, the plurality of individual substrate sections may be discarded during subsequent processing.

Each sectioned electrical circuit 302 of FIG. 6 can have a length, a width, and a thickness. In an example, each electrical circuit 302 can have a length of from about 0.2 μm to about 2000 μm, a width of from about 0.2 μm to about 2000 μm, and a thickness of from about 0.1 μm to about 60 μm. Electrical circuits 302 having other dimensions outside these ranges are also contemplated. A plurality of sectioned electrical circuits 302 is referred to herein as "powder," "chaff," or "confetti" 600.

Each of the first plugs 202 and second plugs 402 can have a length, a width, and a thickness. In an example, each plug 202, 402 can have a length of from about 1 nm to about 40 nm, a width of from about 1 nm to about 40 nm, and a thickness of from about 4 nm to about 40 nm, although other dimensions are contemplated.

Subsequently, the chaff 600 is exposed to an environment that is conducive to the growth of CNTs. In an example, the chaff 600 is unsupported, free-floating, and suspended within a CNT-forming environment, such as a CVD reactor chamber, without physically contacting a surface of the reactor, at least for a period of time, during the formation of the CNTs. As such, both the first plugs 202 and the second plugs 402 are simultaneously exposed to the environment and CNTs simultaneously form on the first plugs 202 on a first major surface of the circuits 302 and the second plugs 402 on a second major surface of the circuits 302, where the first major surface is opposite the second major surface.

Figure 7:
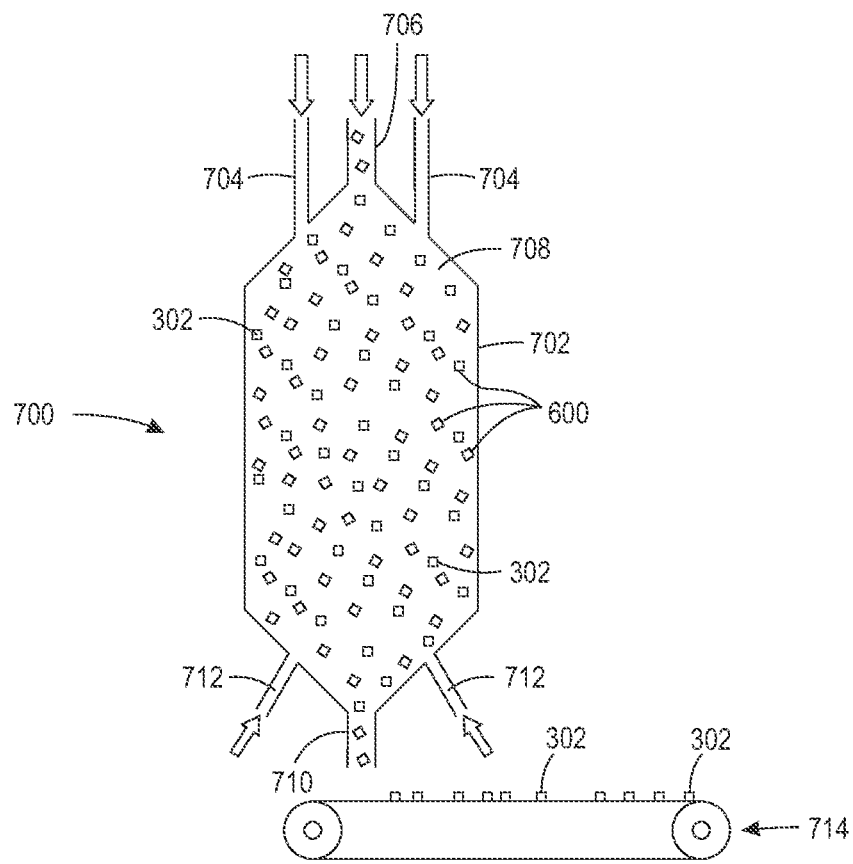

In an example, the environment may be within a CVD furnace or CVD reactor 700 as depicted in FIG. 7, such as a vertical furnace containing a silica tube 702 configured for the synthesis of CNTs, with one or more suitable gas and/or product access ports 704 for CNT precursor gases and/or products, and at least one chaff access port 706 for the chaff 600. CNT precursor gases can include, for example, one or more hydrocarbons, alcohols, aromatic compounds, naturally occurring carbon resources, ethylene, acetylene, methane, carbon monoxide and ethanol. In an example, the access ports 704 may include two streams of dry, filtered nitrogen, helium, and/or argon that pass through a furnace chamber 708 from the top downward. One stream may be bubbled through a solution of toluene saturated with ferrocene. The flow rates in the two streams may be around 300 cubic centimeters (cc/min) bubbled and 700 cc/min pure. The furnace may be heated to around 705° C. The CNT precursor gases and/or products physically contact the CNT catalyst plugs 202, 402, and then form CNTs on the CNT catalyst plugs 202, 402. This CNT formation process is merely exemplary, and other CNT formation processes are contemplated.

The chaff 600 may be fed or introduced into the chaff access port 706 at any sufficient feed rate. In an example, a single electrical circuit 302 may be fed into the chamber 708, where CNTs are simultaneously formed on the CNT catalyst plugs 202, 402. In another example, tens, hundreds, or thousands of electrical circuits 302 may be fed as chaff into the chamber 708, where CNTs are simultaneously formed on the CNT catalyst plugs 202, 402. In another example, chaff 600 may be fed continuously into the chamber 708 during a continuous CNT formation process, although batch processing is also contemplated. After completion of CNT formation, one or more electrical circuits 302 may be ejected through a reactor or chaff exhaust port 710, and then collected for subsequent processing.

Because of the small dimensions of each electrical circuit 302 that forms the chaff 600, the chaff 600 may fall through the vertical furnace 700 at a rate that allows for a CNT of a sufficient length to form prior to the chaff 600 being ejected through the chaff exhaust port 710. In an example, each electrical circuit 302 may remain within the chamber 708 for from about 10 seconds to about 180 seconds. Growth rates of the CNTs will depend on a number of factors, for example, a temperature within the chamber, gas flow rates and concentrations, the specific CNT precursors injected into the chamber, etc. Growth rates of the CNTs can therefore be selected and controlled to form CNTs of sufficient length for the duration of time the chaff remains within the chamber, from the time it is placed or injected into or enters the chamber 708 through the chaff access port 706, until the time it is ejected or exits the chaff exhaust port 710.

In an example, to increase the time the single electrical circuit 302 or chaff 600 remains within the chamber, a flow of a reactant gas or an inert gas may be introduced into the chamber 708 in an upflow direction, for example, through one or more upflow ports 712. A flow rate of a gas through the upflow ports 712 may be controlled to increase the period of time the chaff 600 remains within the chamber 708, such that the period of time is sufficient to grow CNTs having a desired or sufficient length.

Once the one or more electrical circuits 302 are ejected from the chaff exhaust port, they may be collected for subsequent processing. In an example, the one or more electrical circuits 302 may be collected on a conveyor belt 714 such as a high-speed conveyor belt.

Figure 8:
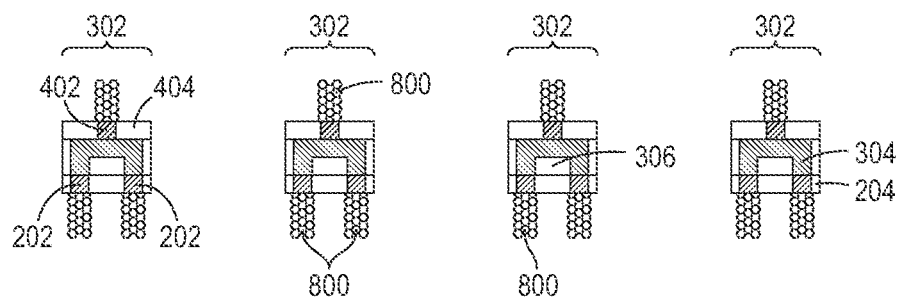

FIG. 8 depicts a plurality of electrical circuits 302 subsequent to the formation of self-aligned CNTs 800 on the first plugs 202 and the second plugs 402. The CNTs 800 may be formed to any desired or sufficient length, for example, from about 2 μm to about 200 μm, or another length.

Figure 9:
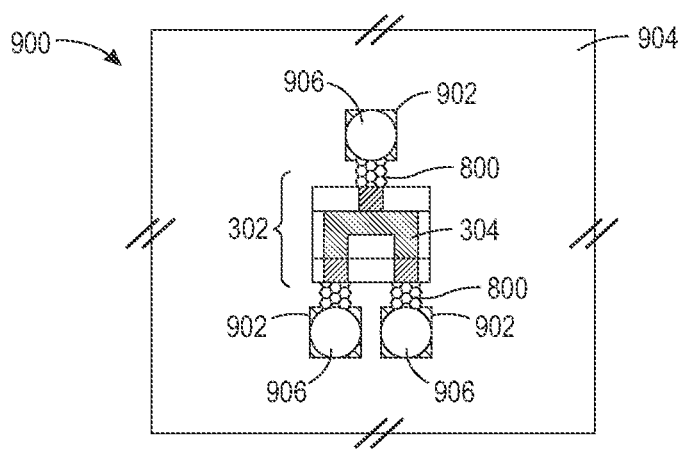
FIG. 9 is a plan view of an electrical device including an electrical circuit electrically coupled to a circuit substrate according to an example of the present disclosure.

FIG. 9 depicts an electrical device 900 having electrical circuit 302 and a plurality of CNTs 800 used as leads to electrically couple one or more conductive layers 304 of the electrical circuit 302 to a plurality of electrically conductive pads 902 on a circuit substrate 904 such as a printed circuit board using a conductor 906 such as solder or an electrically conductive paste. FIG. 9 depicts three electrically conductive pads 902.

In an example, the electrical circuit 302 may be a diode that is part of a larger circuit. In another example, the electrical circuit 302 may be a light emitting diode (LED). In other examples, the electrical circuit 302 may be a digital or analog circuit. It will be appreciated that these electrical circuits are merely exemplary, and other circuit types are contemplated. In an example, the electrical circuit 302 is interposed between the first CNT catalyst layer 200 and the second CNT catalyst layer 400.

Figure 10:
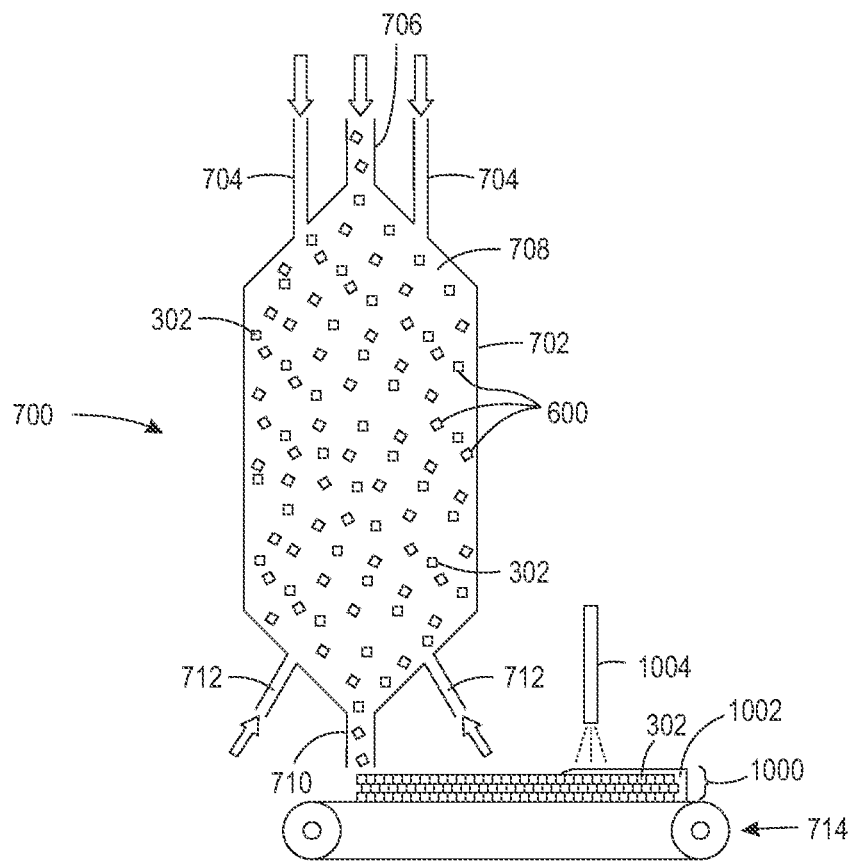
FIG. 10 is a cross section depicting the simultaneous formation of a plurality of electrical circuits having self-aligned carbon nanotube electrical leads on two or more sides or surfaces of the electrical circuit and the formation of a mat of electrical circuits in an example of the present disclosure.

FIG. 10 depicts an example for forming an electrical device in the form of a plurality of interconnected electrical circuits 302 that form a mat 1000. The plurality of electrical circuits 302 may be, for example, a plurality of LEDs. In contrast to the example of FIG. 7, where individual and physically separated electrical circuits 302 are ejected from the exhaust port 710, the example of FIG. 10 forms the mat 1000 where the CNTs 800 (FIG. 8) of a plurality of electrical circuits 302 are intertwined and in electrical communication with each other. Applying a voltage across the mat 1000 is sufficient to power a plurality of LEDs 302 within the mat 1000 to emit a light from the plurality of LEDs 302. While the random electrical connections provided are not anticipated to necessarily provide power to every individual LED 302 within the mat 1000, the small size and large number of LEDs 302 within the mat 1000 may provide a sufficient number of connections within the mat 1000 to provide a continuous electrical path across the entirety of the mat 1000. In an example, the mat 1000 may include a carrier material 1002, such as a liquid polymer carrier material, that is spray coated or otherwise deposited from a carrier dispenser 1004 onto the mat 1000. The carrier material 1002 may diffuse through a thickness of the mat 1000 such that the carrier material 1002 is interposed between adjacent electrical circuits of the plurality of electrical circuits 302. The carrier material 1002 can then be cured using, for example, heat from a heater or ultraviolet radiation from an ultraviolet light source (not individually depicted for simplicity), to hold the plurality of LEDs 302 within the mat 1000 together. In an example, the carrier material may be sprayed or otherwise deposited onto the mat 1000 as the mat 1000 progresses down the conveyor belt 714 as depicted, or the carrier material 1002 may be applied onto the mat 1000 at another location. Additionally, the carrier material may be cured on the conveyer belt 714 or at another location.

To form the mat 1000, the electrical circuits 302 may be fed into the access port 706 and ejected from the exhaust port 710 at a rate sufficient to form the mat 1000. In addition, the speed of the rotating conveyor belt 714 can be adjusted to form a mat 1000 having a sufficient thickness and density of LEDs 302 to form a mat 1000 of electrically interconnected electrical circuits 302.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g., −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or examples of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other examples of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. An in-process electrical circuit within a chamber of a furnace, the in-process electrical circuit comprising:
   a circuit layer comprising a first surface and a second surface opposite the first surface;
   a first carbon nanotube (CNT) catalyst layer comprising a first CNT catalyst plug on the first surface of the circuit layer, wherein the first CNT catalyst plug is electrically coupled to the circuit layer;
   a first CNT contacting and electrically coupled to the first CNT catalyst plug;
   a second CNT catalyst layer comprising a second CNT catalyst plug on the second surface of the circuit layer, wherein the second CNT catalyst plug is electrically coupled to the circuit layer; and
   a second CNT contacting and electrically coupled to the second CNT catalyst plug, wherein the circuit layer is interposed between the first CNT catalyst layer and the second CNT catalyst layer; and
   wherein the in-process electrical circuit is free-floating within the chamber of the furnace and the furnace comprises at least one CNT precursor gas within the chamber of the furnace.

2. The in-process electrical circuit within the chamber of the furnace of claim 1, wherein:
   the first CNT catalyst plug is an electrically conductive material and the circuit layer further comprises an electrical dielectric; and
   the second CNT catalyst plug is an electrically conductive material.

3. The in-process electrical circuit within the chamber of the furnace of claim 2, wherein the first CNT catalyst plug and the second CNT catalyst plug each comprise one or more of chromium, molybdenum, tungsten, iron, cobalt, nickel, ruthenium, rhodium, palladium, osmium, iridium, and platinum.

4. The in-process electrical circuit within the chamber of the furnace of claim 2, wherein the first CNT catalyst plug and the second CNT catalyst plug each comprise one or more of iron, nickel, cobalt, and molybdenum.

5. The in-process electrical circuit within the chamber of the furnace of claim 1, wherein the in-process electrical circuit is an in-process light emitting diode.

6. The in-process electrical circuit within the chamber of the furnace of claim 1, wherein the first CNT catalyst layer has a thickness of from 4 nanometers to 40 nanometers.

7. The in-process electrical circuit within the chamber of the furnace of claim 6, wherein the first CNT plug and the second CNT plug each has a length of from 1 nanometers (nm) to 40 nm, a width of from 1 nm to 40 nm, and a thickness of from 4 nm to 40 nm.

8. The in-process electrical circuit within the chamber of the furnace of claim 1, wherein the at least one CNT precursor gas comprises at least one of a hydrocarbon, an alcohol, an aromatic compounds, a naturally occurring carbon resource, ethylene, acetylene, methane, carbon monoxide, and/or ethanol.

9. The in-process electrical circuit within the chamber of the furnace of claim 1, wherein the furnace comprises at least one upflow port configured to introduce an inert gas into the furnace in an upflow direction.

10. The in-process electrical circuit within the chamber of the furnace of claim 1, wherein the furnace further comprises an exhaust port configured such that the in-process electrical circuit is ejected from the furnace through the exhaust port.

11. The in-process electrical circuit within the chamber of the furnace of claim 10, wherein the furnace further comprises an access port configured such that circuit layer is fed into the access port.

12. A plurality of in-process electrical circuits within a chamber of a furnace, each in-process electrical circuit of the plurality of in-process electrical circuits comprising:
 a circuit layer comprising a first surface and a second surface opposite the first surface;
 a first carbon nanotube (CNT) catalyst layer comprising a first CNT catalyst plug on the first surface of the circuit layer, wherein the first CNT catalyst plug is electrically coupled to the circuit layer;
 a first CNT contacting and electrically coupled to the first CNT catalyst plug;
 a second CNT catalyst layer comprising a second CNT catalyst plug on the second surface of the circuit layer, wherein the second CNT catalyst plug is electrically coupled to the circuit layer;
 a second CNT contacting and electrically coupled to the second CNT catalyst plug, wherein the circuit layer is interposed between the first CNT catalyst layer and the second CNT catalyst layer; and
 at least one CNT precursor gas within the chamber of the furnace,
 wherein the plurality of in-process electrical circuits are free-floating within the chamber of the furnace.

13. The in-process electrical circuit within the chamber of the furnace of claim 12, wherein the first CNT catalyst plug and the second CNT catalyst plug of each of the plurality of in-process electrical circuits comprises one or more of chromium, molybdenum, tungsten, iron, cobalt, nickel, ruthenium, rhodium, palladium, osmium, iridium, and platinum.

14. The in-process electrical circuit within the chamber of the furnace of claim 12, wherein the first CNT catalyst plug and the second CNT catalyst plug of each of the plurality of in-process electrical circuits comprise one or more of iron, nickel, cobalt, and molybdenum.

15. The plurality of in-process electrical circuits within the chamber of the furnace of claim 12, wherein each in-process electrical circuit is an in-process light emitting diode.

16. The in-process electrical circuit within the chamber of the furnace of claim 12, wherein the first CNT catalyst layer has a thickness of from 4 nanometers to 40 nanometers.

17. The in-process electrical circuit within the chamber of the furnace of claim 16, wherein the first CNT plug and the second CNT plug each has a length of from 1 nanometers (nm) to 40 nm, a width of from 1 nm to 40 nm, and a thickness of from 4 nm to 40 nm.

18. The plurality of in-process electrical circuits within the chamber of the furnace of claim 12, wherein the at least one CNT precursor gas comprises at least one of a hydrocarbon, an alcohol, an aromatic compounds, a naturally occurring carbon resource, ethylene, acetylene, methane, carbon monoxide, and/or ethanol.

19. The plurality of in-process electrical circuits within the chamber of the furnace of claim 12, wherein the furnace comprises at least one upflow port configured to introduce an inert gas into the furnace in an upflow direction.

20. The plurality of in-process electrical circuits within the chamber of the furnace of claim 19, wherein the furnace further comprises:
 an exhaust port configured such that the plurality of in-process electrical circuits are ejected from the furnace through the exhaust port; and
 an access port configured such that each circuit layer of the plurality of in-process electrical circuits are fed into the access port.

* * * * *